(12) United States Patent
Satish et al.

(10) Patent No.: US 9,154,157 B2
(45) Date of Patent: Oct. 6, 2015

(54) SEARCH UNIT TO ACCELERATE VARIABLE LENGTH COMPRESSION/DECOMPRESSION

(71) Applicant: Intel Corporation, Santa Clara, CA (US)

(72) Inventors: Nadathur Rajagopalan Satish, Santa Clara, CA (US); Changkyu Kim, San Jose, CA (US); Jatin Chhugani, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 296 days.

(21) Appl. No.: 13/629,467

(22) Filed: Sep. 27, 2012

(65) Prior Publication Data

US 2014/0089276 A1    Mar. 27, 2014

(51) Int. Cl.
*G06F 17/30*    (2006.01)
*H03M 7/30*    (2006.01)

(52) U.S. Cl.
CPC ....................................... *H03M 7/30* (2013.01)

(58) Field of Classification Search
USPC .................. 707/693; 382/246, 233; 341/107; 709/330
See application file for complete search history.

(56) References Cited

U.S. PATENT DOCUMENTS

| | | | | |
|---|---|---|---|---|
| 5,703,581 A | * | 12/1997 | Matias et al. | 341/67 |
| 6,226,628 B1 | * | 5/2001 | Forbes | 707/693 |
| 7,043,088 B2 | * | 5/2006 | Chiu et al. | 382/233 |
| 7,095,343 B2 | * | 8/2006 | Xie et al. | 341/107 |
| 2003/0088715 A1 | * | 5/2003 | Chaudhuri et al. | 709/330 |
| 2008/0095453 A1 | * | 4/2008 | Suzuki et al. | 382/246 |
| 2010/0299316 A1 | * | 11/2010 | Faerber et al. | 707/693 |

\* cited by examiner

*Primary Examiner* — Hung T Vy
(74) *Attorney, Agent, or Firm* — Kenyon & Kenyon LLP

(57) ABSTRACT

Systems and methods to accelerate compression and decompression with a search unit implemented in the processor core. According to an embodiment, a search unit may be implemented to perform compression or decompression on an input stream of data. The search unit may use a look-up table to identify appropriate compression or decompression symbols. The look-up table may be populated with a table derived using the variable length coding symbols of a sequence of vertices to be compressed or extracted from a received data stream to be decompressed. A comparator and a finite state machine may be implemented in the search unit to facilitate traversal of the look-up table.

20 Claims, 6 Drawing Sheets

500

600

SEARCH UNIT TO ACCELERATE VARIABLE LENGTH COMPRESSION/DECOMPRESSION

FIELD OF THE INVENTION

Aspects of the present invention relate generally to the field of memory storage and more specifically to improving processing efficiency of complex instructions.

BACKGROUND

In modern processors, a number of different execution units are used to process and execute a variety of code and instructions. Not all instructions are created equal as some are quicker while others can take a number of clock cycles to complete. Generally, the faster the throughput of instructions, the better the overall performance of the processor. Thus it would be advantageous to have as many instructions execute as fast as possible. However, there are certain instructions that have greater complexity and require more in terms of execution time and processor resources. For example, floating point instructions, load/store operations, data moves, data compression and decompression, graph traversal, etc.

Compression and decompression operations conventionally take significant time identifying an appropriate compression symbol. In modern processors, searching via graph traversal is an algorithm used in a variety of fields, including social networks, business analytics, and high-performance computing. However, the ability to scale out the graph traversal to very large systems is severely limited due to the delay incurred by the processor during inter-node communications. In some systems, compression and decompression symbol identification may help reduce this communication and improve the execution time of graph traversal. Therefore, improving the execution time of complex instructions, including compression and decompression, could improve overall processor timing and throughput.

Therefore, there is a need in the art to more efficiently manage complex instructions, including graph traversal.

BRIEF DESCRIPTION OF THE DRAWINGS

Embodiments are illustrated by way of example and not limitation in the Figures of the accompanying drawings.

DETAILED DESCRIPTION

The following description provides examples, and the accompanying drawings show various examples for the purposes of illustration. However, these examples should not be construed in a limiting sense as they are merely intended to provide examples of embodiments of the present invention rather than to provide an exhaustive list of all possible implementations of embodiments of the present invention.

The following description describes systems and methods to accelerate compression and decompression with a search unit implemented in the processor core. According to an embodiment, a search unit may be implemented to perform compression or decompression on an input stream of data. The search unit may use a look-up table to identify appropriate compression or decompression symbols. A comparator and a finite state machine may be implemented to facilitate traversal of the look-up table.

The look-up table may be populated with table data representing the variable length coding symbols derived from the input data stream to be compressed or may be populated with table data extracted from the input data stream to be decompressed. The table may include columns for compressed symbols, associated uncompressed symbols, and a length value. The look-up table may be sorted by uncompressed symbol for compression and by compressed symbol for decompression to accelerate the search and traversal of the table.

The uncompressed symbols may represent the deltas for the data to be compressed. A sequence of vertices representing the data to be compressed may be input to the processor and the deltas calculated as the differences between vertices. The length value may represent the length, or number of bits, of the compressed symbol.

The search column of the table may then be searched to identify a match in the table to the data input for processing. The row containing the matching search element may be returned. The comparator may determine when a match has been found. Then the state of the finite state machine may be updated to indicate the search has finished.

For compression, the compressed symbol associated with the input delta value may be added to a data stream representing the compressed version of the input data. The compression table may also be added to the data stream. The data stream may then be transmitted to a receiver or stored for further processing. For decompression, the uncompressed delta associated with the input symbol may be added to a data stream that represents the uncompressed version of the input data.

Figure 1:
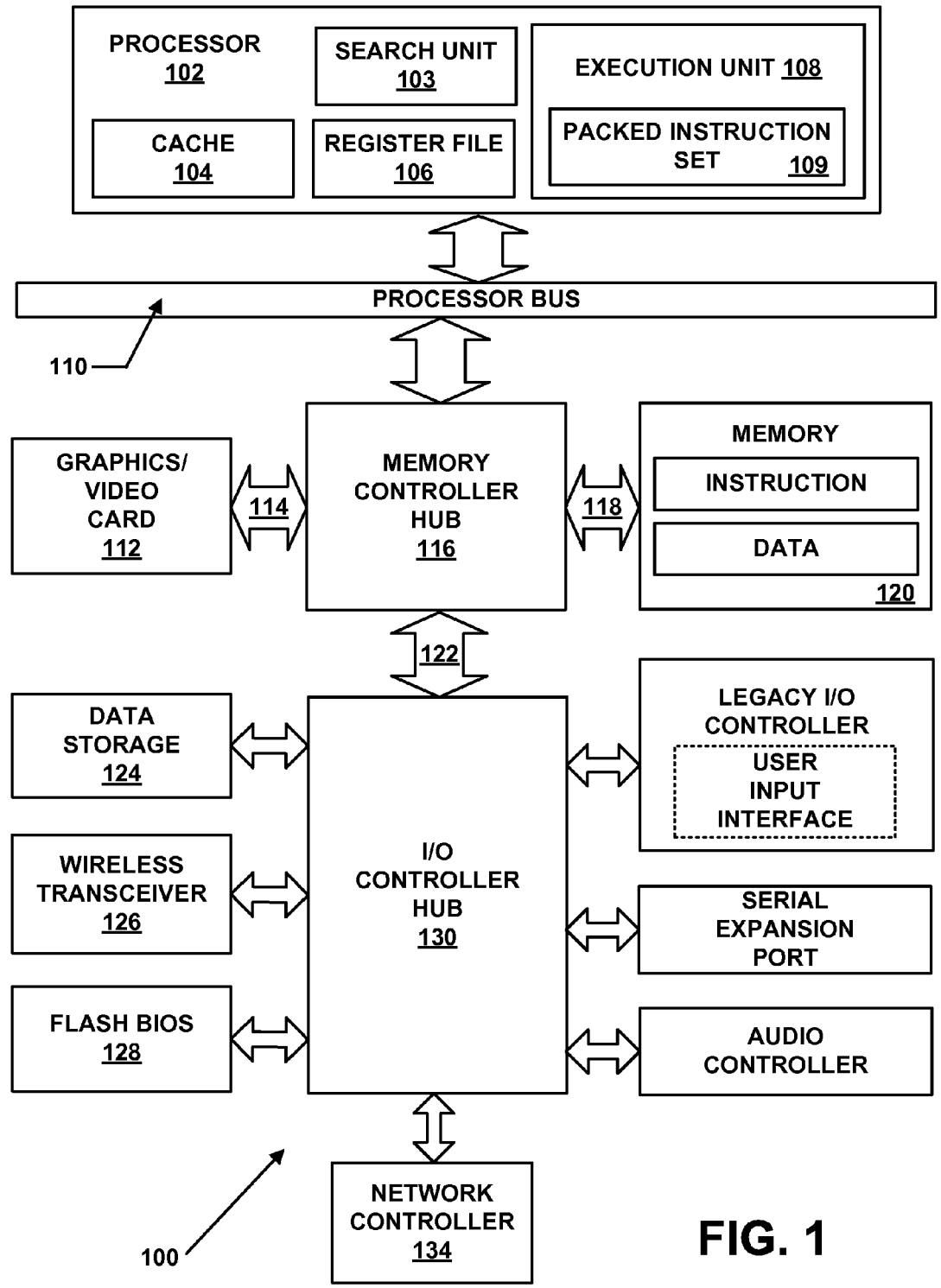
FIG. 1 is a block diagram of an exemplary computer system formed with a processor that includes a search unit in accordance with an embodiment of the present invention.

FIG. 1 is a block diagram of an exemplary computer system 100 formed with a processor that includes a search unit 103 in accordance with an embodiment of the present invention. System 100 includes a component, such as a processor 102 to employ execution units including logic to perform algorithms for processing data.

As shown in FIG. 1, system 100 is an example of a 'hub' system architecture. The computer system 100 includes a processor 102 to process data signals. The processor 102 can be a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 102 may be coupled to a processor bus 110 that can transmit data signals between the processor 102 and other components in the system 100. The elements of system 100 may perform their conventional functions that are well known to those familiar with the art.

In one embodiment, the processor 102 includes a Level 1 (L1) internal cache memory 104. Depending on the architecture, the processor 102 can have a single internal cache or multiple levels of internal cache. Alternatively, in another embodiment, the cache memory can reside external to the processor 102. Other embodiments can also include a combination of both internal and external caches depending on the particular implementation and needs. Register file 106 can store different types of data in various registers including integer registers, floating point registers, status registers, and instruction pointer registers.

Execution unit 108, including logic to perform integer and floating point operations, also resides in the processor 102. The processor 102 may also include a microcode (ucode) ROM that stores microcode for certain macroinstructions. For an embodiment, execution unit 108 includes logic to handle a packed instruction set 109. Alternate embodiments of an execution unit 108 can also be used in micro controllers, embedded processors, graphics devices, DSPs, and other types of logic circuits.

As shown in FIG. 1, system 100 includes a memory 120. Memory 120 can be a dynamic random access memory (DRAM) device, a static random access memory (SRAM) device, flash memory device, or other memory device. Memory 120 can store instructions and/or data represented by data signals that can be executed by the processor 102.

A system logic chip 116 is coupled to the processor bus 110 and memory 120. The system logic chip 116 in the illustrated embodiment is a memory controller hub (MCH). The processor 102 can communicate to the MCH 116 via a processor bus 110. The MCH 116 provides a high bandwidth memory path 118 to memory 120 for instruction and data storage and for storage of graphics commands, data and textures. The MCH 116 is to direct data signals between the processor 102, memory 120, and other components in the system 100 and to bridge the data signals between processor bus 110, memory 120, and system I/O 122. In some embodiments, the system logic chip 116 can provide a graphics port for coupling to a graphics controller 112. The MCH 116 may be coupled to memory 120 through a memory interface 118. The graphics card 112 may be coupled to the MCH 116 through an Accelerated Graphics Port (AGP) interconnect 114.

System 100 uses a proprietary hub interface bus 122 to couple the MCH 116 to the I/O controller hub (ICH) 130. The ICH 130 provides direct connections to some I/O devices via a local I/O bus. The local I/O bus is a high-speed I/O bus for connecting peripherals to the memory 120, chipset, and processor 102. Some examples are the audio controller, firmware hub (flash BIOS) 128, wireless transceiver 126, data storage 124, legacy I/O controller containing user input and keyboard interfaces, a serial expansion port such as Universal Serial Bus (USB), and a network controller 134. The data storage device 124 can comprise a hard disk drive, a floppy disk drive, a CD-ROM device, a flash memory device, or other mass storage device.

For another embodiment of a system, a search unit in accordance with an embodiment of the present invention can be implemented with a system on a chip. One embodiment of a system on a chip comprises of a processor and a memory. The memory for one such system is a flash memory. The flash memory can be located on the same die as the processor and other system components. Additionally, other logic blocks such as a memory controller or graphics controller can also be located on a system on a chip. It will be readily appreciated by one of skill in the art that the embodiments described herein can be used with alternative processing systems without departure from the scope of embodiments of the invention.

Figure 2:
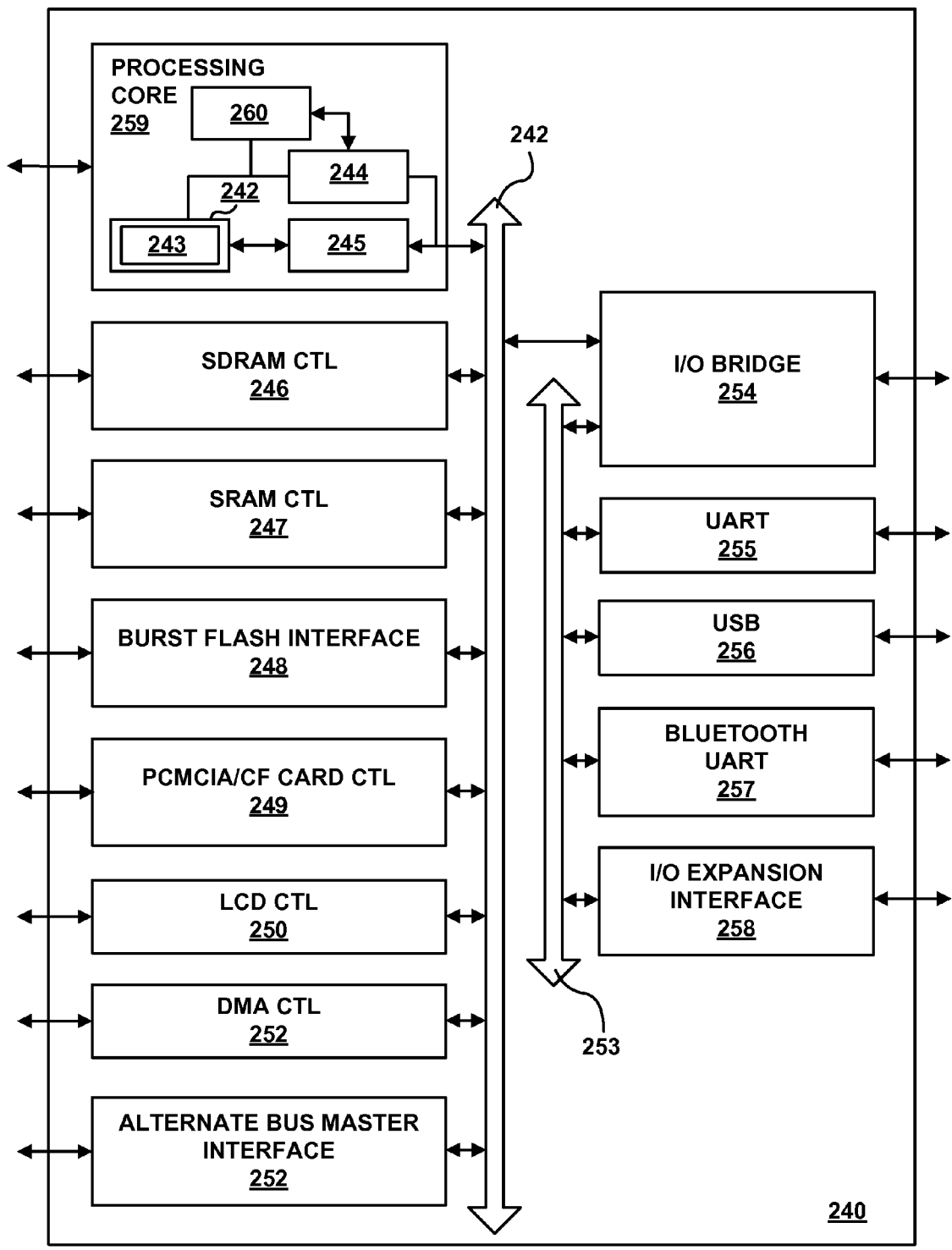
FIG. 2 illustrates a data processing system according to an embodiment of the present invention.

FIG. 2 illustrates a data processing system 240 according to an embodiment of the present invention. System 240 may comprise a processing core 259 capable of performing at least one instruction in accordance with one embodiment. According to an embodiment, processing core 259 represents a processing unit of any type of architecture, including but not limited to a CISC, a RISC or a VLIW type architecture. Processing core 259 may also be suitable for manufacture in one or more process technologies and by being represented on a machine readable media in sufficient detail, may be suitable to facilitate said manufacture.

Processing core 259 may include an execution unit 242, a set of register file(s) 245, and a decoder 244. The processing core 259 may additionally include a specialized search unit 260 designed according to an embodiment of the present invention to accelerate compression and decompression of data. Execution unit 242 may be used for executing instructions received by processing core 259. In addition to performing typical processor instructions, execution unit 242 can perform instructions in packed instruction set 243 for performing operations on packed data formats. Processing core 259 may also include additional circuitry (not shown) which is not necessary to the understanding of embodiments of the present invention.

As shown, execution unit 242 is coupled to register file 245 by an internal bus. Register file 245 represents a storage area on processing core 259 for storing information, including data. As previously mentioned, it is understood that the storage area used for storing the packed data is not critical. Execution unit 242 may be coupled to decoder 244. Decoder 244 is used for decoding instructions received by processing core 259 into control signals and/or microcode entry points. In response to these control signals and/or microcode entry points, execution unit 242 performs the appropriate operations. In one embodiment, the decoder is used to interpret the opcode of the instruction, which will indicate what operation should be performed on the corresponding data indicated within the instruction.

Processing core 259 is coupled with bus 242 for communicating with various other system devices, which may include but are not limited to, for example, synchronous dynamic random access memory (SDRAM) control 246, static random access memory (SRAM) control 247, burst flash memory interface 248, personal computer memory card international association (PCMCIA)/compact flash (CF) card control 249, liquid crystal display (LCD) control 250, direct memory access (DMA) controller 251, and alternative bus master interface 252. According to an embodiment, data processing system 240 may also comprise an I/O bridge 254 for communicating with various I/O devices via an I/O bus 253. Such I/O devices may include but are not limited to, for example, universal asynchronous receiver/transmitter (UART) 255, universal serial bus (USB) 256, Bluetooth wireless UART 257 and I/O expansion interface 258.

One embodiment of data processing system 240 provides for mobile, network and/or wireless communications and a processing core 259 capable of performing SIMD operations including a text string comparison operation. Processing core 259 may be programmed with various audio, video, imaging and communications algorithms including discrete transformations such as a Walsh-Hadamard transform, a fast Fourier transform (FFT), a discrete cosine transform (DCT), and their respective inverse transforms; compression/decompression techniques such as color space transformation, video encode motion estimation or video decode motion compensation; and modulation/demodulation (MODEM) functions such as pulse coded modulation (PCM).

Figure 3:
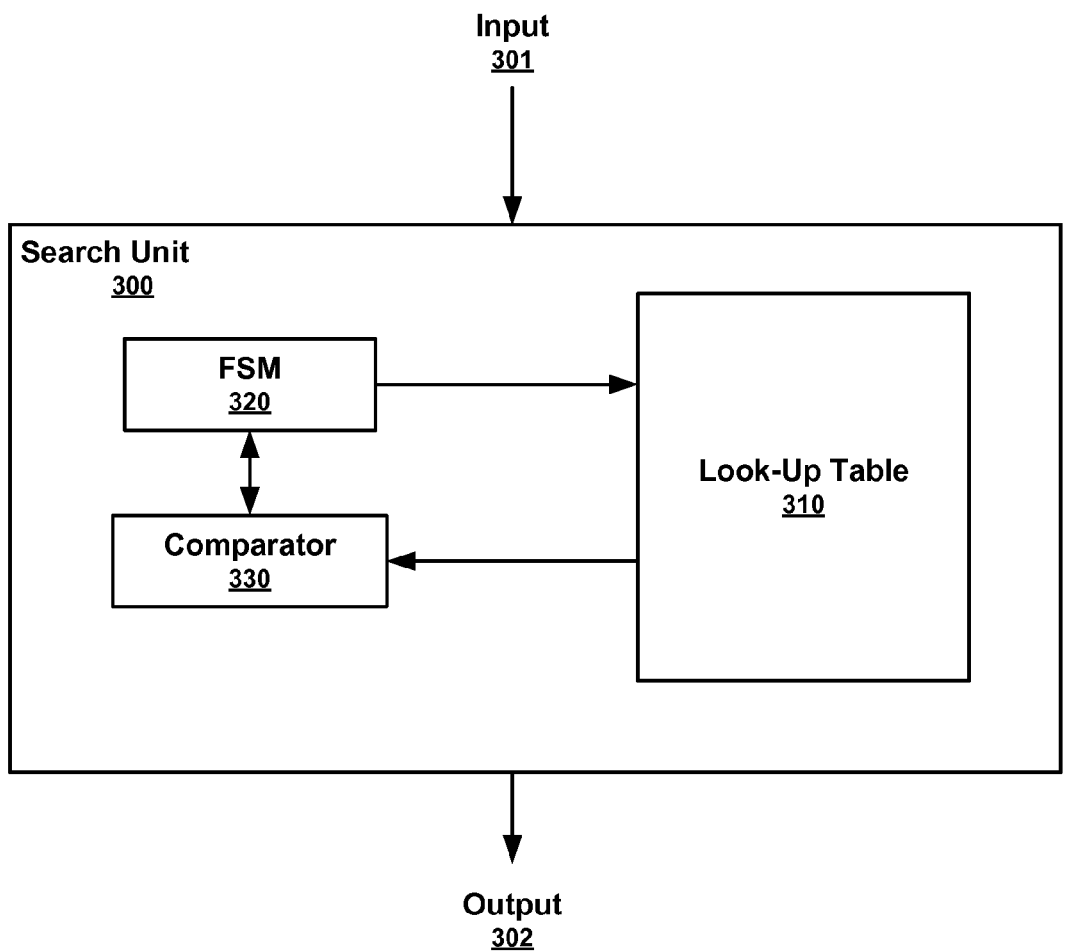
FIG. 3 is a simplified block diagram illustrating an exemplary search unit in accordance with an embodiment of the present invention.

FIG. 3 is a simplified block diagram illustrating an exemplary search unit 300 in accordance with an embodiment of the present invention. The exemplary search unit 300 may include a look-up table 310, a finite state machine (FSM) 320, and a comparator 330. The search unit 300 may receive an input 301 for look-up in the table 310 and then provide as an output 302 the results of the search.

As part of an iterative search of the look-up table, the comparator 330 may compare a respective portion of each row of the look-up table 310 to the input 301 to identify any differences between the input and the stored symbol. Then the FSM 320 may be implemented as a binary search control to indicate if there is match. If there is no match, the FSM 320 may indicate that the traversal through the look-up table 310 should continue. If there is a match, the FSM 320 may indicate that the traversal through the look-up table 310 should terminate and the row of the look-up table 310 corresponding to the match may be output 302.

If the look-up table 310 is implemented for compression of data, the look-up table may be populated with a table created from a graph that may be used for the coding. For example, each symbol may be assigned a variable length code for compression wherein the assignment of codes may be based on the frequency of use of each symbol. Then the codes representing compressed symbols may be arranged in a tree or graph to facilitate the search for an appropriate compression symbol via traversal of the graph to compress a data stream. Then the compression look-up table 310 may be populated with a table representing the encoding graph. For example, using a sequence of vertices representing the data for compression, a Huffman table may be created for variable length coding and the look-up table 310 may be populated with the created table.

In accordance with an embodiment, the graph populating the compression look-up table 310 may be generated from a sequence of vertices where the sequence of vertices includes the symbols of the data to be compressed. According to an embodiment, the sequence of vertices may first be converted into a sequence of deltas, thereby eliminating unnecessary data that is consistent across vertices. Then the calculated deltas may be compressed using the look-up table 310, the FSM 320, and the comparator 330 of the search unit 300 and the resultant compressed data output 302 from the search unit 300.

If the look-up table 310 is implemented for decompression of compressed data, the look-up table 310 may be populated with a graph that may be used for the decoding. The decompression table representing the decoding graph may be extracted from a compressed data stream and the look-up table 310 may be populated with the extracted table. In accordance with an embodiment, the graph populating the decompression look-up table 310 may be extracted from an input sequence of compressed symbols with an associated decompression graph. Then the input data 301 may be decompressed using the look-up table 310, the FSM 320, and the comparator 330 of the search unit 300 and the resultant decompressed data output 302 from the search unit 300. In an embodiment, the decompression look-up table 310 may identify deltas corresponding to the input sequence of compressed data 301. Then the identified deltas may be converted into a sequence of vertices representing the uncompressed data.

In accordance with an embodiment, the look-up table 310 may be implemented in static random access memory (SRAM). Then using a 32 KB SRAM for the look-up table may result in 4096 64-bit entries. Using variable length compression/decompression (VLCD), the number of unique codes will typically be less than the 4096 entries. Then, search unit 300 having a look-up table 310 implemented with the described SRAM may be utilized to efficiently search large amounts of data. For example, the cost of searching the look-up table 310 with the search unit 300 varies between 2 cycles and 2*log(the number of unique symbols) cycles.

In accordance with an embodiment, a single search unit 300 may be implemented in a processing core. Then the search unit 300 may be utilized for both data compression and data decompression. Accordingly, the look-up table 310 may be populated with the appropriate table each time the search unit 300 transitions from compression to decompression and from decompression to compression. If a Huffman table is used, populating the look-up table 310 may incur a negligible overhead where the table is relatively small compared to the data stream.

Figure 4:
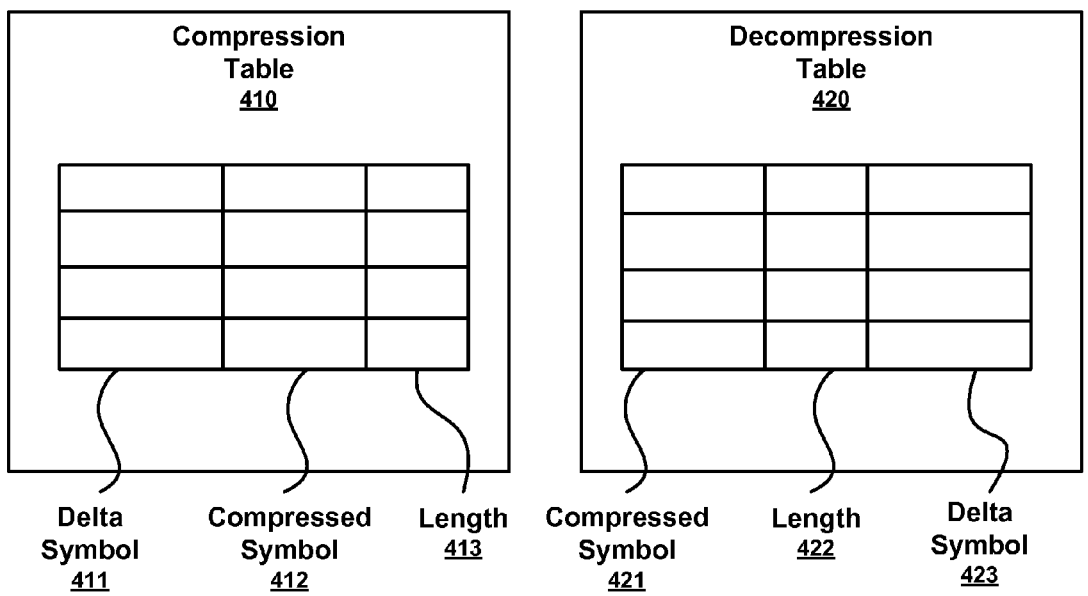
FIG. 4 is a simplified block diagram illustrating exemplary tables implemented within a search unit in accordance with an embodiment of the present invention.

FIG. 4 is a simplified block diagram illustrating exemplary tables implemented within a search unit in accordance with an embodiment of the present invention. As shown in FIG. 4, each row of a look-up table may have multiple portions or components. For example, the rows stored in a compression look-up table 410 may include a delta symbol 411, a corresponding compressed symbol 412, and a length value 413. Then the compression table 410 may be sorted by delta symbol 411 to facilitate searching the look-up table as part of the compression of deltas input into the search unit. Similarly, the rows stored in a decompression look-up table 420 may include a compressed symbol 421, a length value 422, and a delta symbol 423. The decompression table 420 may be sorted by compressed symbol 421 to facilitate decompression of compressed data input into the search unit. In accordance with an exemplary embodiment, the delta values may be allocated 32 bits, the length may be allocated 5 bits, and the compressed symbol may be allocated 27 bits of a 64-bit look-up table row. With 27 available bits for the compressed symbol, the look-up table may be configured to accommodate more than 1 TB of graph data.

Then the search unit may receive an input for compression and search the first column of the look-up table for a value matching the input. For example, a match may be found when the delta symbol 411 or the compressed symbol 421 of a given row is equivalent to the input value. Then the matching row may be identified by the search unit as corresponding to the input data and the entire row may be returned. The compressed symbol 412 or delta symbol 423 may be extracted from the returned row and included in a resultant data stream.

Figure 5:
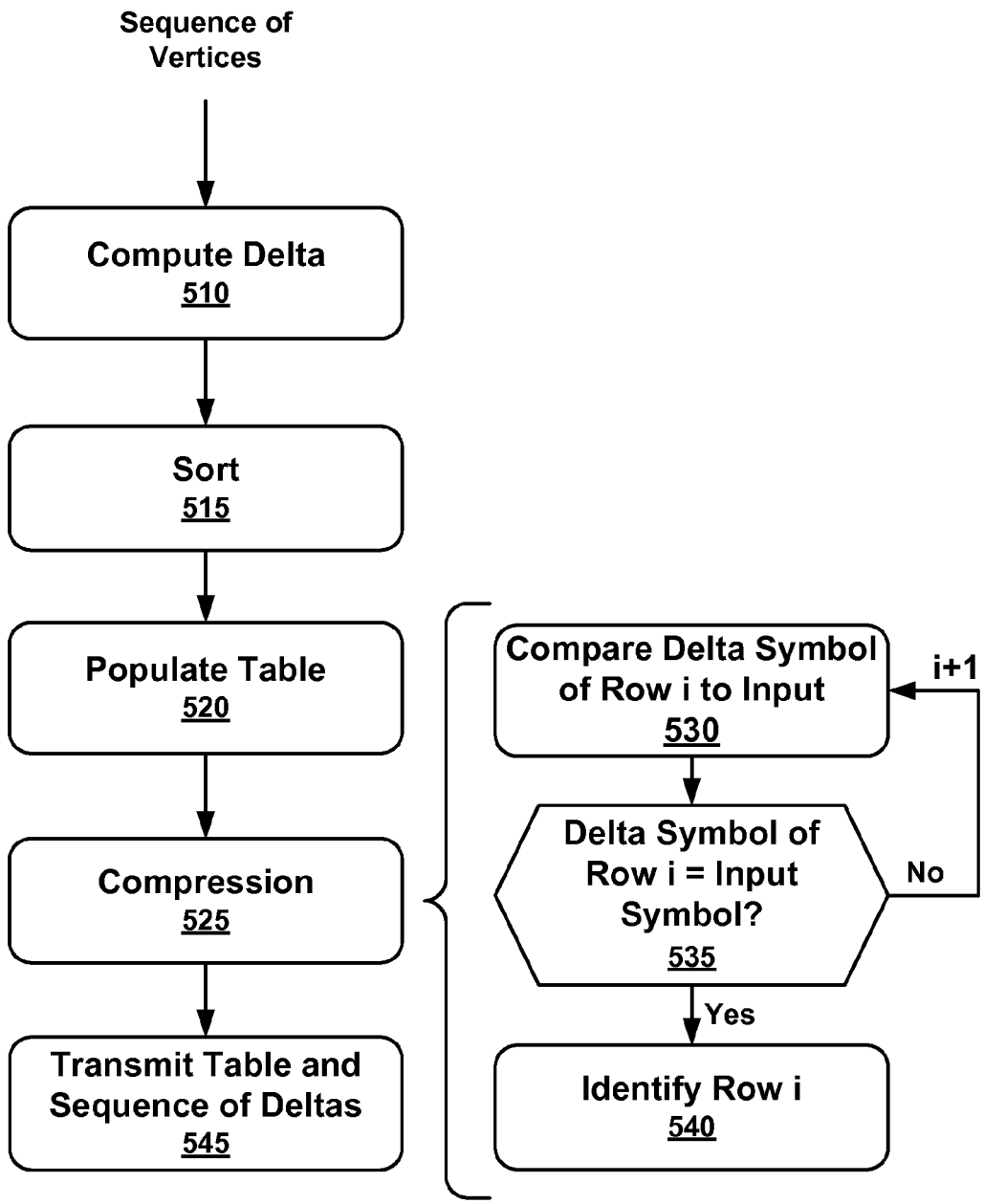
FIG. 5 is a simplified flow diagram illustrating an exemplary method for data compression using a search unit in accordance with an embodiment of the present invention.

FIG. 5 is a simplified flow diagram illustrating an exemplary method 500 for data compression using a search unit in accordance with an embodiment of the present invention. As shown in FIG. 5, a sequence of vertices may be received as input into the search unit. Preliminarily, the search unit may compute the deltas for the received sequence of vertices (block 510). The deltas may be computed by identifying the differences between the vertices. Then the computed deltas may be sorted to facilitate searching the computed deltas (block 515). The sorted deltas may then be used to populate a look-up table (block 520). Each row of the look-up table may include at least the delta value and the compressed symbol for the given delta value.

In an embodiment, the compression table may be calculated by the processor or other component outside the search unit and transmitted to the search unit. Then the received table may be used to populate the search unit look-up table.

Once a look-up table has been populated, the search unit may use the look-up table to compress input data (block 525). To compress the data, the search unit may compare the input data to the delta symbol of a given row in the table (block 530). Then if the input data matches the delta symbol (block 535), the row of the look-up table containing the matching delta value may be identified (block 540). The identification of the matching row may include returning or outputting some portion or all of the identified row. The compressed symbol stored in the identified row may represent the compressed input data. However if the input data does not match the delta symbol (block 535), the delta symbol in the next row of the look-up table may be evaluated to identify a matching delta (block 530).

Once the input data has been compressed, the compressed symbols may be added to a data stream to be transmitted to a decoder, memory storage, or other receiver. The populated look-up table may additionally be included as part of the data stream such that the receiver may utilize the compression look-up table information to populate a decompression look-up table that will facilitate proper decompression of the compressed symbols (block 545).

Figure 6:
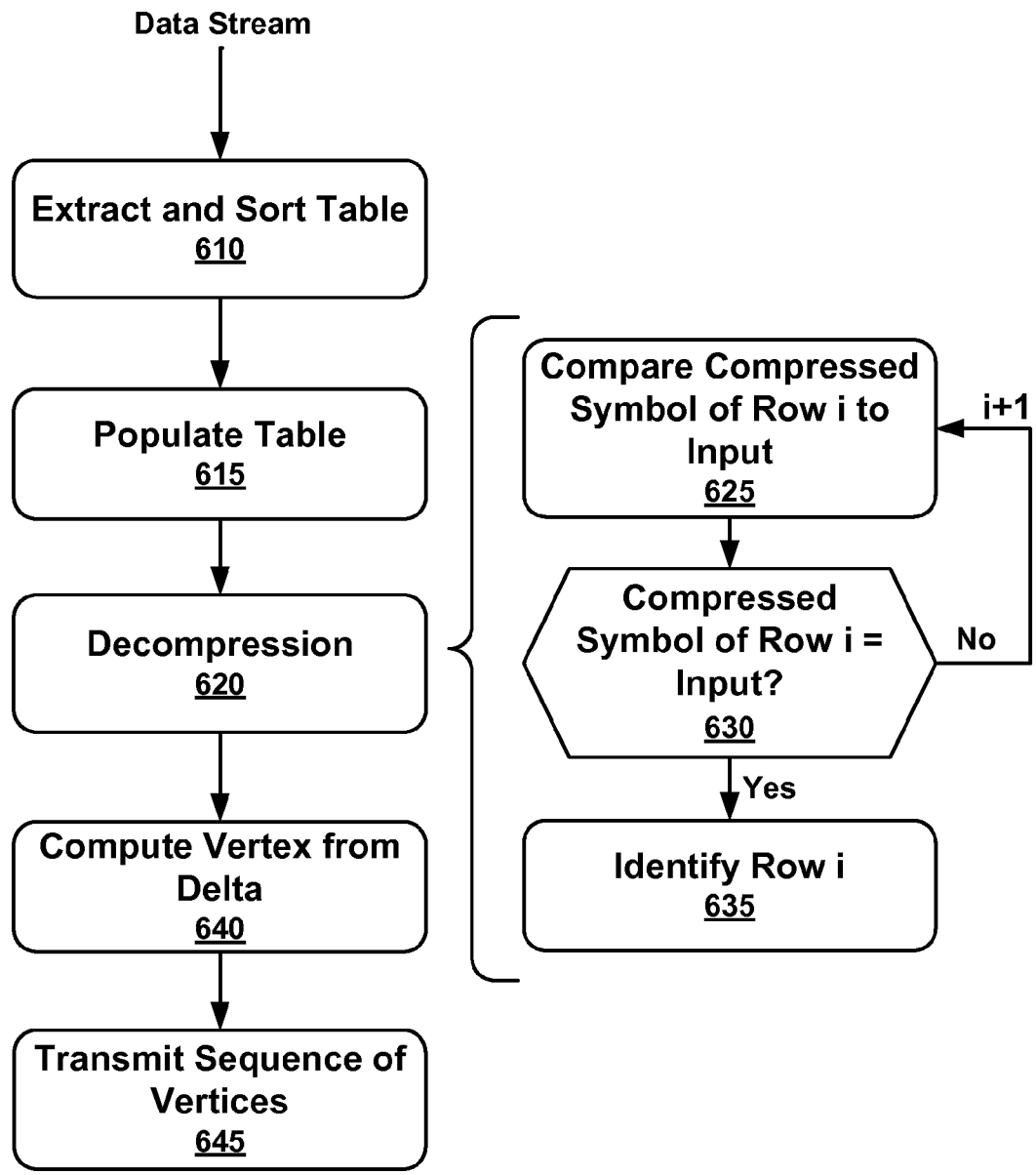
FIG. 6 is a simplified flow diagram illustrating an exemplary method for data decompression using a search unit in accordance with an embodiment of the present invention.

FIG. 6 is a simplified flow diagram illustrating an exemplary method 600 for data decompression using a search unit in accordance with an embodiment of the present invention. As shown in FIG. 6, a data stream may be received as input into the search unit of a decoder. Preliminarily, the search unit may extract a look-up table from the data stream and sort the table by compressed symbol (block 610). The sorted compressed symbols may then be used to populate a decompression look-up table (block 615). Each row of the look-up table may include at least the compressed symbol and an associated (decompressed) delta symbol.

Once a look-up table has been populated, the search unit may use the look-up table to decompress the compressed data received with the data stream (block 620). To decompress the data, the search unit may compare the compressed input data to the compressed symbol of a given row in the look-up table (block 625). Then if the input data matches the compressed symbol (block 630), the row of the look-up table containing the matching compressed symbol value and the corresponding delta symbol may be identified (block 635). However if the input data does not match the compressed symbol (block 630), the compressed symbol in the next row of the look-up table may be evaluated to identify a matching symbol (block 625).

Once the input data has been decompressed, the vertex value of the data may be calculated from the decompressed delta symbols (block 640). The decompressed data may then be added to a data stream and transmitted to a display or storage device (block 645).

Embodiments of the system described herein have been implemented with a high performance computer (HPC). However, system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, may also be suitable for implementing an embodiment of the system described. In general, a huge variety of systems or electronic devices capable of implementing a search unit as disclosed herein are generally suitable.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device. Program code may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

In the foregoing description, numerous specific details such as processing logic, processor types, micro-architectural conditions, events, enablement mechanisms, and the like have been set forth in order to provide a more thorough understanding of embodiments of the present invention. It will be appreciated, however, by one skilled in the art that the invention may be practiced without such specific details. Additionally, some well known structures, circuits, and the like have not been shown in detail to avoid unnecessarily obscuring embodiments of the present invention.

Although the above examples describe instruction handling and distribution in the context of execution units and logic circuits, other embodiments of the present invention can be accomplished by way of data or instructions stored on a non-transitory machine-readable, tangible medium, which when performed by a machine cause the machine to perform functions consistent with at least one embodiment of the invention. In one embodiment, functions associated with embodiments of the present invention are embodied in machine-executable instructions. The instructions can be used to cause a general-purpose or special-purpose processor that is programmed with the instructions to perform the steps of the present invention. Embodiments of the present invention may be provided as a computer program product or software which may include a machine or computer-readable medium having stored thereon instructions which may be used to program a computer (or other electronic devices) to perform one or more operations according to embodiments of the present invention. Alternatively, steps of embodiments of the present invention might be performed by specific hardware components that contain fixed-function logic for performing the steps, or by any combination of programmed computer components and fixed-function hardware components.

Instructions used to program logic to perform embodiments of the invention can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information.

As more computer systems are used in internet, text, and multimedia applications, additional processor support has been introduced over time. In one embodiment, an instruction set may be associated with one or more computer architectures, including data types, instructions, register architecture, addressing modes, memory architecture, interrupt and exception handling, and external input and output (I/O).

In one embodiment, the instruction set architecture (ISA) may be implemented by one or more micro-architectures, which includes processor logic and circuits used to implement one or more instruction sets. Accordingly, processors with different micro-architectures can share at least a portion of a common instruction set. For example, the same register architecture of the ISA may be implemented in different ways in different micro-architectures using new or well-known techniques, including dedicated physical registers, one or more dynamically allocated physical registers using a register renaming mechanism (e.g., the use of a Register Alias Table (RAT)), a Reorder Buffer (ROB) and a retirement register file. In one embodiment, registers may include one or more registers, register architectures, register files, or other register sets that may or may not be addressable by a software programmer.

In one embodiment, an instruction may include one or more instruction formats. In one embodiment, an instruction format may indicate various fields (number of bits, location of bits, etc.) to specify, among other things, the operation to be performed and the operand(s) on which that operation is to be performed. In one embodiment, an instruction is expressed using an instruction format (and, if defined, in a given one of the instruction templates of that instruction format) and specifies or indicates the operation and the operands upon which the operation will operate.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Thus, techniques for performing compression/decompression operations according to at least one embodiment are disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure. The foregoing description provides examples, and the accompanying drawings show various examples for the purposes of illustration. However, these examples should not be construed in a limiting sense as they are merely intended to provide examples of embodiments of the present invention rather than to provide an exhaustive list of all possible implementations of embodiments of the present invention. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. A method for performing efficient operations to compress or decompress data, the method comprising:
    receiving, at a processor core, data comprising a table to be searched;
    sorting, at the processor core, the table data by a search column;
    populating, in a search unit within the processor core, a look-up table with the sorted table data;
    receiving, at the search unit, data for processing, wherein the data for processing comprises a plurality of symbols;
    for each symbol in the data for processing:
        searching, with the search unit, the look-up table for a match to the symbol;
        identifying, with the search unit, a matching row of the look-up table;
        adding, at the processor core, a portion of the matching row to a data stream for output;
        transmitting, from the search unit, the output data stream to a receiver, wherein the output data represents a transformation of the data for processing into compression values or decompression values corresponding to the data for processing.

2. The method of claim 1, wherein each row of the look-up table includes a compressed delta symbol, a delta symbol, and a length.

3. The method of claim 2, wherein the plurality of symbols comprise a plurality of deltas for compression.

4. The method of claim 3, wherein the search column is a column of the table comprising delta values.

5. The method of claim 3, wherein the portion of the matching row comprises a compressed delta of the associated symbol.

6. The method of claim 2, further comprising: calculating, at the processor core, delta values for each element in the received table data.

7. The method of claim 1, wherein the table data is generated using variable length coding for a sequence of vertices.

8. The method of claim 7, wherein the data for processing comprises the sequence of vertices.

9. The method of claim 7, wherein the table data comprises a Huffman table.

10. The method of claim 1, wherein the data for processing is to be compressed.

11. The method of claim 1, wherein the data for processing is to be decompressed.

12. The method of claim 11, wherein the plurality of symbols comprise a plurality of compressed deltas.

13. The method of claim 12, wherein the search column is a column of the table comprising compressed deltas.

14. The method of claim 12, wherein the portion of the matching row comprises a decompressed delta value of the associated symbol.

15. The method of claim 1, further comprising: for each portion of a matching row added to the output data stream, calculating, at the processor core, an original symbol of the delta value.

16. A search unit implemented in a processor core, the search unit to perform efficient operations to compress or decompress data, the search unit comprising:
- a memory unit configured to store a look-up table;
- a comparator; and
- a finite state machine (FSM) configured to control a binary search of the look-up table;
- wherein the search unit is configured to:
  - receive table data;
  - populate the look-up table with the received table data;
  - receive data for processing, wherein the data for processing comprises a plurality of symbols and for each symbol in the plurality of symbols:
    - search the look-up table for a match to the symbol,
    - identify, with the comparator, a matching row of the look-up table,
    - upon identification of the matching row, update the FSM and return the matching row;
  - generate an output data stream for transmission to a receiver, wherein the output data represents a transformation of the data for processing into compression values or decompression values corresponding to the data for processing.

17. The search unit of claim 16, wherein the data for processing is to be compressed.

18. The search unit of claim 17, wherein the plurality of symbols comprise a plurality of deltas for compression.

19. The search unit of claim 16, wherein the data for processing is to be decompressed.

20. The search unit of claim 19, wherein the plurality of symbols comprise a plurality of compressed deltas.

* * * * *